United States Patent [19]
Todd

[11] Patent Number: 5,789,124
[45] Date of Patent: Aug. 4, 1998

[54] METHOD OF MONITORING LITHOGRAPHIC RESIST POISONING

[75] Inventor: Bradley Gene Todd, Highland, N.Y.

[73] Assignee: International Business Machines Corporation, Armonk, N.Y.

[21] Appl. No.: 764,901

[22] Filed: Oct. 10, 1996

[51] Int. Cl.$^6$ .................................................. G03C 5/00
[52] U.S. Cl. ......................... 430/30; 430/302; 430/311; 430/330; 382/145
[58] Field of Search ......................... 430/30, 302, 311, 430/330; 382/145

[56] References Cited

U.S. PATENT DOCUMENTS 5,240,812  8/1993  Conley et al. .......................... 430/273
5,452,052  9/1995  Takado et al. .......................... 355/53

OTHER PUBLICATIONS

"Semiconductor Lithography Principles, Practices, and Materials"; Wayne M. Moreau; Microdevices; Physics and Fabrication Technologies.

"A Simple and Calibratable method for the Determination of Optimal Focus"; J. W. Gemmick; SPIE vol. 1088 Optical; 1989; pp. 222–226.

"Exposure Monitor Structure"; Alexander Starikov; IBM Corp.; Advanced Technology Center SPIE vol. 1261 integrated Circuit Metrology, Inspection, and Process Control IV (1990); pp. 315–324.

Primary Examiner—Christopher G. Young
Attorney, Agent, or Firm—Whitham, Curtis & Whitham; Alison Mortinger

[57] ABSTRACT

Direct detection of poisoning of chemically amplified and other lithographic resists by ambient gases is achieved in substantially real time and with extremely high sensitivity by making test exposures of the resist at different doses such as by a graded density feature. Sensitivity may be made unconditionally adequate to ensure that uniform and predictable by separating test exposures by a time interval in excess of the amount of time necessary for lithographic exposure of chip areas on a wafer. Sensitivity increase may also obtained, particularly in combination with time separation of test exposures, from the use of sub-resolution features for grading density of a test mask pattern feature which quantizes exposure sensitivity at high resolution. Measurement of test exposure patterns may be accomplished in an overlay optical metrology tools in the same process in which lithographic resist patterning is measured to reduce time and process steps. The onset of failure of gas treatment systems may be detected well in advance of the time such failure can cause unpredictable resist response to patterning exposure.

20 Claims, 4 Drawing Sheets

METHOD OF MONITORING LITHOGRAPHIC RESIST POISONING

BACKGROUND OF THE INVENTION

1. Field of the Invention

The present invention generally relates to extremely high resolution lithography and, more particularly, to lithographic resists suitable for forming extremely fine patterns by lithographic processes and methods and arrangements for detecting environmental contamination thereof.

2. Description of the Prior Art

Increases in integration density of semiconductor integrated circuits provides not only the economic benefits of reduced cost per transistor or logic circuit therein but substantial performance increases due to reduction in capacitance of conductors and transistors and reduction of signal propagation time over the interconnecting conductors which may be of reduced length by virtue of high integration density. However, high integration density implies extremely fine patterning of features, particularly in transistors and interconnection circuits. Lithographic processes for production of high density integrated circuits have become highly developed and are capable of producing features measured in fractions of a micron at the present time.

At extremely high resolutions and small feature sizes, the size of features which may be imaged by lithographic processes becomes highly dependent on the wavelength of the radiation or energy used for exposure of lithographic resists. Accordingly, shorter wavelengths of exposure radiation (e.g. deep ultra-violet (DUV), X-rays and electron beams) have come into use in order to avoid interference and diffraction effects when imaging closely spaced features. Of course, the resists used are also generally preferentially responsive to particular wavelengths of exposure radiation and new resists have been developed for each new regime of exposure radiation wavelength. In particular, recent improvements in DUV exposure systems has led to development of resists which can be exposed by wavelengths in the DUV regime.

So-called thermally degrading resists are increasingly used in the DUV regime, even though originally developed for use with electron beam (e-beam) systems and less than optimally sensitive to DUV wavelengths. For example, materials such as polymethylmethacrylate (PMMA) and its derivatives have a maximum spectral absorption at about 215 nm and thus are not well-matched to DUV exposure wavelengths; having a reduced sensitivity thereto. Typically a one minute exposure is necessary for a one um thick resist film, using a Hg-Xe arc lamp, as noted in "VLSI Fabrication Principles", by Sorab K. Ghandhi, John Wiley & Sons, New York, 1994. Such extended exposure times reduce exposure tool throughput but, more importantly, may reduce manufacturing yield by allowing production of optical artifacts of exposure such as "ghost patterns" due to diffraction effects and inaccuracy of resulting pattern due to scattering of radiation within the resist layer. Long exposure may also subject the exposed pattern to degradation through vibration or other transient conditions.

However, addition of other materials such as polymethyl isopropenyl ketone to the resist can extend the absorption range to about 290 nm, resulting in an improvement in sensitivity to DUV by about a factor of five. Sensitivity can be further improved by the addition of sensitizing agents such as p-terbutyl benzoic acid. Such resists including additives for shifting optical absorption characteristics and/or otherwise increasing sensitivity are generically referred to as chemically amplified resists.

Chemically amplified resists, however, are extremely susceptible to poisoning by environmental pollutants such as amines, notably $NH_3$, a common airborne semiconductor processing clean room contaminant. Being thermally degrading resists, a post-exposure bake (PEB) is generally required and sensitivity to environmental pollutants is especially great between exposure and PEB. Airborne concentrations of less than 1 PPB can cause poisoning of the resist. Poisoning of the resist in such a manner results in unpredictable feature size since resist poisoning alters resist sensitivity to exposure radiation. This problem is aggravated by the fact that very few negative resists are available for DUV lithography and a decrease in sensitivity of a positive resist has the effect of increasing the feature size ultimately produced.

Accordingly, elaborate filtering systems possibly including chemically amplified resist active gas removers have been proposed to reduce the contaminant gas in a chamber used during exposure of the resist. However, there is no assurance that such an arrangement is effective during any particular exposure. Moreover, there is presently no quantitative monitoring system which will indicate the onset of failure of material-specific gas remover arrangements and which tend to fail comparatively quickly when a capacity is reached. Similarly, a topcoat layer of material which is impermeable to active gases is proposed in U.S. Pat. No. 5,240,812. However, success in forming such a topcoat layer is not assured and may compromise lithographic exposure by scattering within the topcoat layer or other effects such as increase of required exposure dose due to the additional boundaries of coating material through which exposure must be made and the lack of perfect transparency of such a topcoat layer.

In short, such arrangements do not provide a fully adequate solution to the problem of resist poisoning as would a complete absence or reduction to extremely low concentrations of contaminant gases. Such low concentrations can only be assured by direct detection of the contaminant gases in the environment of the resist. Several such monitoring arrangements are known but are also less than fully effective for the purpose.

For example, sampling the atmosphere in the environment of the resist and subjecting the samples to testing by liquid chromatography has a limited sensitivity of about ten PPB and requires laboratory analysis with ensuing delays (generally about three days). Therefore, such a process is not suitable for the detection of concentrations of contaminants found to cause unpredictability of feature size and delays may allow the concentration of contaminant gases to change as well as reducing throughput and increasing cost of the lithographic process. Certainly such delays and low sensitivity severely compromise the accuracy with which the onset of failure of a filtration or active gas removal system may be discovered. Further, such a process does not directly measure the degree of resist poisoning which may have occurred or is possible.

Similar sampling and processing utilizing ion chromatography has a potential sensitivity of 0.1 PPB but is costly and takes several weeks to obtain results. Like liquid chromatography, the concentration of contaminant gases may change over such a period, throughput is severely compromised and the degree of resist poisoning is not directly measured. Even though a different trade-off between delay in obtaining results and test sensitivity is provided, such tests remain largely unsuited for monitoring and detecting the onset of failure of filtering and active gas removal schemes.

It is also possible to measure $NH_3$ contaminant gas concentration in a much shorter time using an ion mobility analyzer. However, the instrument itself is very costly and does not directly measure the degree of resist poisoning while having a sensitivity which is limited to about one PPB even though lower concentrations may cause unpredictable patterning. Other potential contaminant gases are not measurable with such an instrument and the instrument must be calibrated or tuned to a specific measurable material of interest.

The only method for direct measurement of the degree of resist poisoning known prior to the present invention is to use a scanning electron microscope (SEM) to directly measure the profiles of cross-sections of the resist after patterning. However, the equipment costs are large and the test is destructive of potentially usable chips or wafers as well as time consuming. Additionally, subtle changes in profiles which are difficult to observe even with this technique may still cause unacceptable variation in electrical characteristics of the devices manufactured. Due to the expense of such a technique and the marginal utility of the results, this technique is not considered to be an acceptable method for monitoring the degree of resist poisoning for chemically amplified resists.

In summary, no technique has been known prior to the present invention for direct measurement of the degree of resist poisoning which is of adequate sensitivity and acceptable speed, cost and reliability. Additionally, even if some degree of resist poisoning may be unavoidable and tolerable, no known technique has been capable of direct measurement of resist poisoning while eliminating other potential variables, such as inaccuracy of exposure focus or appropriate minimum exposure dose, which may simulate some effects of resist poisoning.

SUMMARY OF THE INVENTION

It is therefore an object of the present invention to provide an inexpensive method and arrangement for providing rapid evaluation of the extent of resist poisoning.

It is another object of the invention to provide an alternative method and arrangement for direct measurement of the degree of resist poisoning.

It is a further object of the present invention to provide a method and apparatus for simultaneous measurement of resist poisoning and determination of appropriate minimum exposure dose while eliminating other variables of resist processing which may simulate effects of resist poisoning.

In order to accomplish these and other objects of the invention, a method of monitoring lithographic resist poisoning by ambient materials is provided including the steps of exposing a portion of a layer of lithographic resist with exposure radiation over a range of exposure dosage and a contaminant gas, developing the lithographic resist, determining an exposure dose which results in full removal of the resist, and evaluating a degree of resist poisoning based on an exposure dose determined in said determining step.

In accordance with another aspect of the invention, a method of determining a degree of poisoning of a lithographic resist on a wafer including the steps of exposing a first portion of resist with an exposure tool in a pattern having a graded density feature, subsequently, after a time interval, exposing a second portion of resist with an exposure tool in a pattern having a graded density feature, developing the resist, and comparing images made by exposure of first and second portions of resist to determine a degree of resist poisoning.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
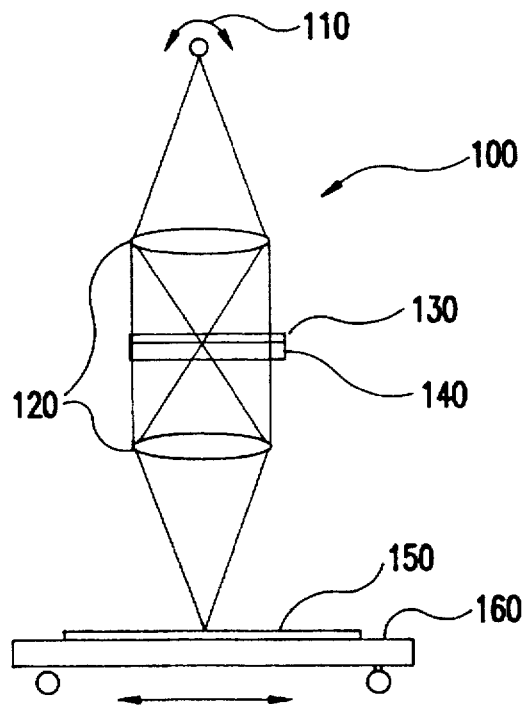
FIG. 1 is a schematic diagram of a first embodiment of the invention.

Referring now to the drawings, and more particularly to FIG. 1, there is shown, in highly schematic form, a basic exposure arrangement 100 for exposing resist patterns on a wafer. Basically, the arrangement 100 includes an energy source 110 for providing energy of a suitable wavelength (e.g. DUV, e-beam, etc.) and may include filters (not otherwise shown) to limit light output to a single or limited number of spectral peaks. A lens system 120, which may be of an optical, magnetic or electrostatic type, depending on the energy source is included and may contain optical elements for providing magnification or reduction in image size, astigmatism correction and the like and is preferably as fully corrected as possible for the wavelength of energy with which exposure is to be made. An exposure mask 130 is generally formed of chrome on a glass substrate and may be patterned to correspond to the features of a material layer of an electronic circuit to be produced. The details of the lens system 120 are unimportant to the practice of the invention but it is common practice to provide for a reduction of image size of a factor of about four or five relative to the size of feature patterns on exposure mask 130.

It is also common to provide for movement of the imaging system (110, 120, 130 and 140) relative to a wafer 150 to reduce the necessary complexity of mask 130 by allowing for plural chip areas to be imaged in a step-and-repeat process, as schematically depicted by translation table 160. Such a translation table or similar arrangement for movement of the lens system 100 relative to the wafer 150 is very accurately movable in either or both of two orthogonal directions while maintaining the surface of wafer 150 in the focal plane of the imaging system.

The wafer 150 is thus provided with exposure areas on which lithographic patterns corresponding to layers of an electronic circuit chip or at least patterned processing thereof masked by resist patterns are formed. These exposure areas are generally separated by kerfs or spaces corresponding to the areas removed by a saw or other tool when the processed wafer is diced into chips. It is the common practice to include alignment marks in these kerfs. It is contemplated and preferred that the images made in accordance with the invention and as will be described below to detect resist poisoning will preferably and advantageously be made in such kerf spaces although it is not necessary but only economically desirable to do so in the successful practice of the invention.

Resist poisoning reduces the exposure sensitivity of a resist whether of the chemically amplified type or not. (The invention is thus applicable to monitoring the degree of poisoning of all types of resists in which environmental poisoning may occur.) Since the development of a resist pattern controls areas where processing is to take place, a proper exposure dose is very near to the minimum which will cause selective removal of the resist in either exposed or unexposed areas depending on whether the resist is of a positive or negative type. As noted above, very few negative resists suitable for DUV exposure are known and, for simplicity, the remainder of the discussion will assume a positive resist where the minimum effective or E0 dose is the minimum exposure dose which, upon development, will fully remove the resist in exposed areas. It is desirable to establish and utilize the E0 dose as accurately as possible since greater exposure requires more time and/or exposure intensity than is required, increasing the expense of the exposure process while over-exposure can only degrade the exposed pattern through "blooming" and other effects, such as scattering, noted above.

Generally, resists are relatively "high contrast" and any remaining resist after development will inhibit the lithographic process. Therefore, consideration of a gray scale in the following discussion generally does not affect and is not utilized in lithographic patterning but is observable in the practice of the invention. Specifically, in its simplest form, the invention involves making a plurality of exposures of a resist at different exposure energy doses. For this purpose, it is preferred to use a nearly opaque but leaky, uniform density mask and to control increments of exposure dose at energy source 110 by time or intensity or both. It is generally desirable to keep exposure time as short as the leaky mask permits to avoid significant scattering effects within the resist. However, exposure tools are generally designed to operate at extremely high speed and exposure intensity. Therefore, reduction of light source intensity by a relatively large factor using a nearly opaque leaky mask is possible.

The incremental change in intensity reliably reproducible with a DUV exposure tool is also generally larger than is desirable in the practice of the invention. Thus, a leaky mask (i.e. a commercially available, so-called 6.5% chrome mask) is currently preferred which, when the non-ideal degree of transparency of the glass substrate on which it is formed is considered, reduces the exposure dose by about 90% relative to the exposure dose which would otherwise be produced. Similarly, the dose increment which can be produced reliably and repeatably by the exposure tool or lens system is similarly reduced by a factor of ten for high sensitivity and resolution of test results.

Figure 2A:
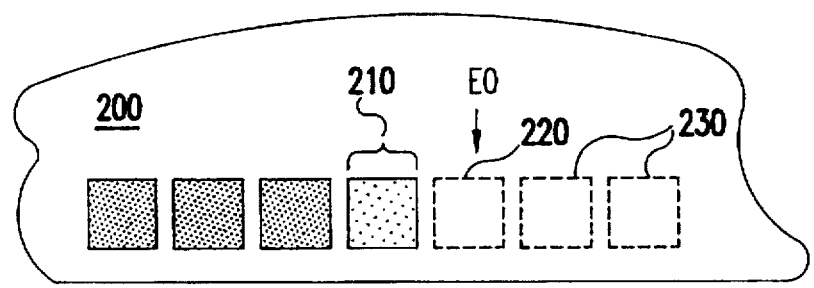
FIGS. 2a, 2b and 2c are representative exposure patterns formed by the embodiment of FIG. 1.

Assuming such a leaky mask for practice of the invention and that the leakiness of the mask is relatively uniform in density over the exposure field, a step-and-repeat series of exposures of increasing dose (e.g. left to right) is depicted in FIG. 2a. The range of exposure doses should exceed the range of sensitivity or exposure latitude of the resist by a significant factor (e.g. 0.9×to 2.5× the normal E0 dose or more, possibly limited by the exposure dose which can be developed by the exposure tool at economically acceptable levels of throughput).

Figure 2B:
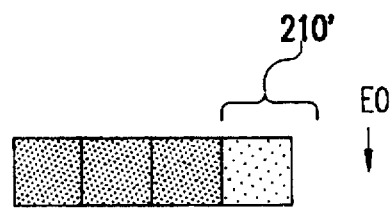
Figure 2C:
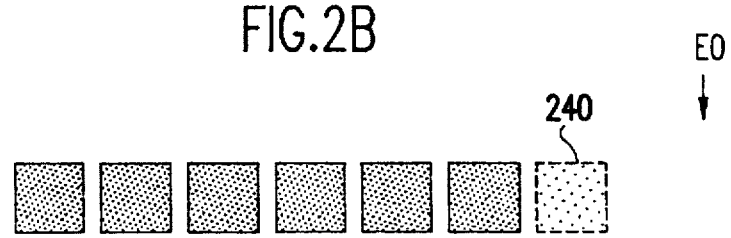

It should be understood that, in the interest of clarity and requirements for the drawings, exposure areas which are unexposed (or less than fully exposed) and where resist remains after development are rendered black in FIGS. 2a–2c as would be the appearance of the unexposed background 200, as is anticipated in the preferred manner of practicing the invention (using a positive resist). In any event, such a sequence of exposures will normally result in one or more of the exposure areas (e.g. 210) being developed to a tone of a gray scale with one or more adjacent areas being fully developed. That is, exposure areas 220 and 230 will be fully developed and such full development will be readily apparent from visual inspection, particularly since a fully exposed and developed area will be adjacent to an exposure area which will be developed to a gray scale tone or undeveloped. The E0 dose will thus correspond to exposure area 220 and will indicate an exposure dose which can reliably pattern the resist.

The E0 dose is thus empirically determined and, as such, is a measure of the sensitivity of the resist even though slight but tolerable poisoning of the resist may be present. Since the sensitivity of the resist in the absence of poisoning is also approximately known, the degree of resist poisoning can be directly measured to relatively high accuracy by merely counting the number of fully exposed exposure areas 220, 230.

For example, as shown in FIG. 2c, poisoning of the resist results in a shift of the E0 dose to the right. As in the rendering of FIG. 2c, if exposure area 240 corresponds to the highest exposure dose available and that area, upon development, has a gray scale tone, an unacceptable degree of resist poisoning would have occurred (e.g. the E0 dose is outside the tested exposure range, as illustrated). In this way, ample warning of the onset of failure of filtration or active gas removal systems is provided by the invention well prior to the degree of poisoning which will compromise the lithography of circuit elements.

The lithographic exposure dose is not, however, changed to compensate for resist poisoning since increased exposure doses will increase the width of etched geometries. For example, with no resist poisoning, substantially straight walls are formed in the resist pattern by development and the pattern is accurately transferred during etching. If the exposure dose is increased to compensate for resist poisoning, the resist pattern will undercut when developed although the dimension at the surface (most severely affected by poisoning) remains the same. Etching in accordance with the undercut resist thus causes the dimension of the remaining material to be less than the desired dimension.

Referring now to FIG. 2b, a variation of the invention also capable of directly testing resist poisoning. In this case, the leaky mask 130 is preferably graded to provide a range of exposure dose across an exposure area which approximates or, preferably, equals the minimum increment of exposure dose available from the exposure tool (after attenuation of the dose by the leaky mask, as before). Grading of the mask can be readily achieved by production of a pattern of dots or lines at variable spacing which are reduced to sub-resolution size (e.g. a size which cannot be resolved by the imaging system 120—30% of minimum feature size is sufficient) at the wafer surface by optical system 120. An area of the resist will thus receive an exposure dose greater than E0 due to the light transmitted by the fine, sub-resolution features. The exposure areas can be contiguous, as illustrated, or separated in the manner of the exposure areas of FIGS. 2a and 2c. Alternatively, a single mask graded from opaque to transparent can be used in a single exposure if the exposure tool is capable of illuminating an area of adequate transverse dimension in order to produce a range of exposure dosage comparable to that of FIG. 2a in a single exposure. The required transverse dimension of the exposure can also be reduced by increasing the density gradient across the mask. If graded density is achieved by the use of variably spaced sub-resolution dimension lines, the increase in the density gradient need not decrease resolution or sensitivity of the test and can, in fact, increase resolution and sensitivity as will be discussed below. In any case, the exposure dose required to achieve complete clearing of the resist during development will be precisely indicated (e.g. at the rightmost portion of the area 210' in which a gray scale tone results from development, as indicated at the right side of the bracket) and the E0 dose established at the corresponding exposure dose or an arbitrary increment thereover.

It should also be appreciated that both variations of the invention described above allow for an empirical determination of the E0 dose and a relative degree of resist poisoning while providing ample warning of the onset of failure of filtration or active gas removal system or other gas treatment system. However, the actual degree of resist poisoning depends upon an approximation of the exposure sensitivity of the unpoisoned resist. Nevertheless, the invention may be practiced to good effect even without such an approximation so long as the exposure doses (allowing for exposure dose attenuation by the mask) can be arranged to provide for determination of the E0 dose within the range of the test. Such a criterion can readily be met and the range of the test can be established based on only accumulated experience with the resist, such as by providing an exposure range which exceeds, by an arbitrary amount, the exposure dose required for acceptable exposures of the most and least sensitive samples of the resist previously used.

It has also been found that the sensitivity of the test in accordance with the invention can be improved in unexpected degree by making two sets of test exposures separated in time. For example, making two test exposures about five minutes apart increases the sensitivity to contaminant gases of the test in accordance with the invention by about a factor of ten. More specifically, it has been found that the amount of resist poisoning for a particular concentration of contaminant gases varies with the duration of exposure to the contaminant gases. Since the exposure of a chip area can generally be conducted quite rapidly and a full wafer exposed in step-and-repeat fashion in a matter of about one minute or less, test exposures at times separated by an amount of time greater than the duration of exposure to contaminant gases required for lithographic exposure of the chips on a wafer will produce a sensitivity much greater than that required for successful contaminant gas monitoring and exposure dose correction for resist poisoning which may occur for a given contaminant concentration. In fact, a relatively slight increase in duration of exposure to contaminants (e.g. two to four fold) over the duration of exposure to contaminants required by the lithographic exposure yields a ten-fold increase in sensitivity to contaminant concentration.

This unexpected and highly disproportionate increase in test sensitivity to the parts per trillion (ppt) range provides an even earlier detection of the onset of failure of filtration or active gas removal arrangements. Accordingly, there is no reason to test every wafer at such high sensitivity and, in practice, the number of wafers tested can be markedly reduced. Further, since the duration of exposure to contaminant gases required by the duration of the lithographic exposure is known, an absolute degree of resist poisoning can be determined. The cost of a test at such increased sensitivity is limited to a very few minutes of exposure tool time (e.g. a reduction in throughput of exposure of one to three wafers) which is more than offset by the potential reduction of the number of wafers on which tests are conducted.

In this regard, it should be noted that the increased sensitivity of the test engendered through increased duration of exposure to contaminants is relative. If the number of step-and-repeat chip exposures for a single wafer consumes the entirety of the time between test exposures, the increased sensitivity of the test, although developed, will not be of comparative advantage if the duration of exposure to contaminants required by the lithographic exposure is equally long. However, the time interval between test exposures may be increased arbitrarily beyond the duration of lithographic exposures to allow exploitation of increased test sensitivity. Additionally, although no correction of exposure dose is made, the change in E0 dose from the first chip exposure to the last chip exposure indicates quantifiable resist poisoning.

Further, it should be appreciated that conducting a test which includes exposures separated in time for increasing sensitivity provides the possibility of direct measurement of an absolute degree of resist poisoning. Moreover, like the variations of the invention described above, since the test involves only direct exposure of the resist with known exposure doses, all other variables of the lithographic exposure and resist damage processes are eliminated from the test and quantitative results thereof. A further variation of the invention which is preferred for this purpose will now be explained in connection with FIGS. 3 and 4.

Figure 3:
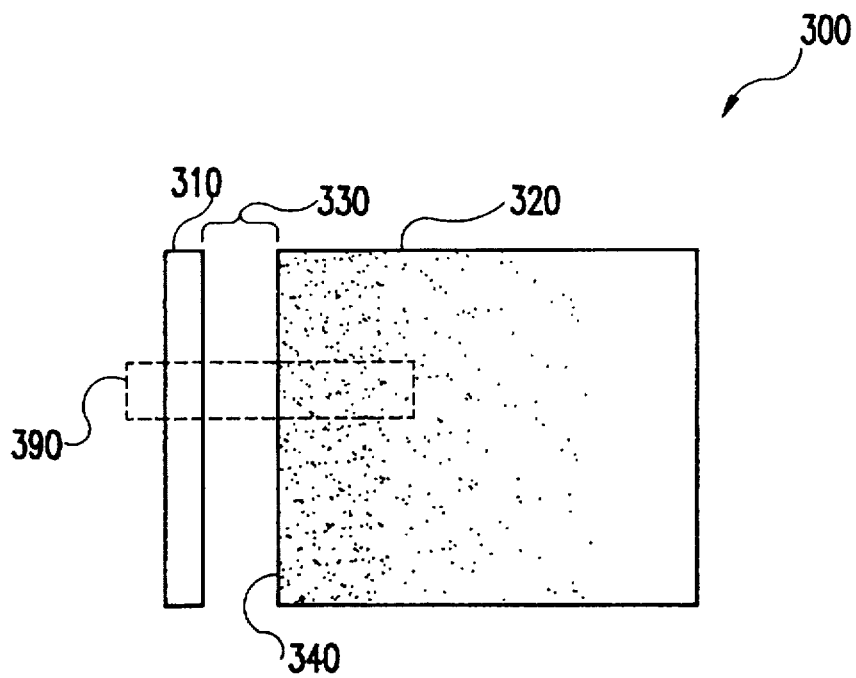
FIG. 3 is a mask pattern in accordance with a preferred form of the invention.

Specifically, FIG. 3 shows an exposure mask pattern 300 including two spatially separated features, 310 and 320. These features are depicted as rectangles which are preferred for convenience but it should be understood that the overall shapes of the features are not critical to the practice of the invention and arbitrary shapes can be used. Feature 310 is a clear or uniform density mask aperture having relatively low attenuation of exposure radiation. Feature 320 is a feature preferably having a graded density (e.g. a dot or line pattern in which the dots are of sub-resolution size when projected onto a resist layer, as in FIG. 2b). Alternatively, multiple exposures could also be used instead of a graded feature but it is considered preferable to make test exposures in single exposure operations so that sensitivity of the test may be more readily evaluated, as will be explained below. Highest attenuation within the feature 320 should preferably be adjacent feature 310. The separation 330 between features 310 and 320 is arbitrary but known and thus feature 310 provides a reference or "anchor" for determining the location of edge 340 of feature 320.

Figure 4:
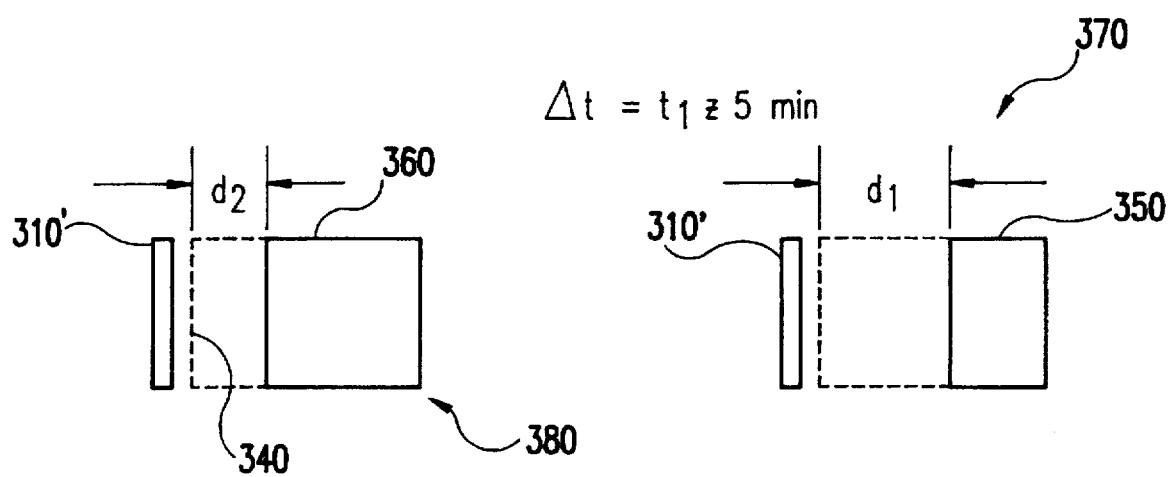
FIG. 4 is a representative image of two test patterns formed by the embodiment of the invention using the mask pattern of FIG. 3.

If two exposures, separated in time, are then made using mask pattern 300, upon development of the resist, images such as are illustrated in FIG. 4 will be created. It is evident that the image feature 310' corresponding to mask feature 310 appears in the image formed by both exposures while the areas 350, 360 and separations $d_2$, $d_1$ from feature 310' formed by graded mask feature 320 differs between the two images. As noted above, higher susceptibility of the resist to poisoning occurs between the time of exposure and the post-exposure bake (PEB). Therefore, while both areas will have the same duration of exposure to contaminants, the duration of exposure to contaminants after exposure by the exposure tool will differ and the first exposure area will receive a greater degree of poisoning than the second, the latter being made immediately before the PEB. Thus, assuming that image 370 is exposed several minutes before image 380 and both images receive the same exposure dose and are exposed to the same concentration of contaminant gases, image 370 will receive a greater degree of poisoning. Accordingly, the developed area 350 will lose sensitivity to exposure radiation and, when developed, will be of smaller area than area 360 of image 380 due to the graded exposure dose provided across each feature by the graded pattern 320. This difference in the images allows the determination of several parameters of the exposure and the test.

Specifically, if the duration between test exposures $t_1$ is long relative to the time required for lithographic chip exposures across the wafer, the E0 dose may be empirically determined as a function of $d_2$ only, particularly if the difference between $d_1$ and $d_2$ is small to moderate, and approximately accounts for unavoidable poisoning during the duration of the lithographic exposure. (If desired for larger differences of $d_1$ and $d_2$, corrections of E0 can be interpolated, as alluded to above. In this regard, an additional test exposure mid-way through the lithographic exposure may provide a better approximation of the E0 dose but has been found unnecessary so long as the duration of the lithographic exposures is short compared to $t_1$ and the lithographic exposures are not widely separated in time, again compared to $t_1$, from the second test exposure.) The test sensitivity, as indicated above, is a function of $t_1$ only. The degree of poisoning is a function of the test sensitivity and the difference in developed or undeveloped areas. Since the test sensitivity is a function of $t_1$, the degree of resist poisoning and the concentration of contaminant gases are both functions of $(d_1-d_2)$ and $t_1$. The functions, themselves, are arbitrary but a simple empirically determined or even roughly approximated proportionality factor will allow successful practice of the invention to derive the advantages and purposes described above. The functions can also be refined or arbitrarily adjusted as accumulated experience allows.

Figure 3A:
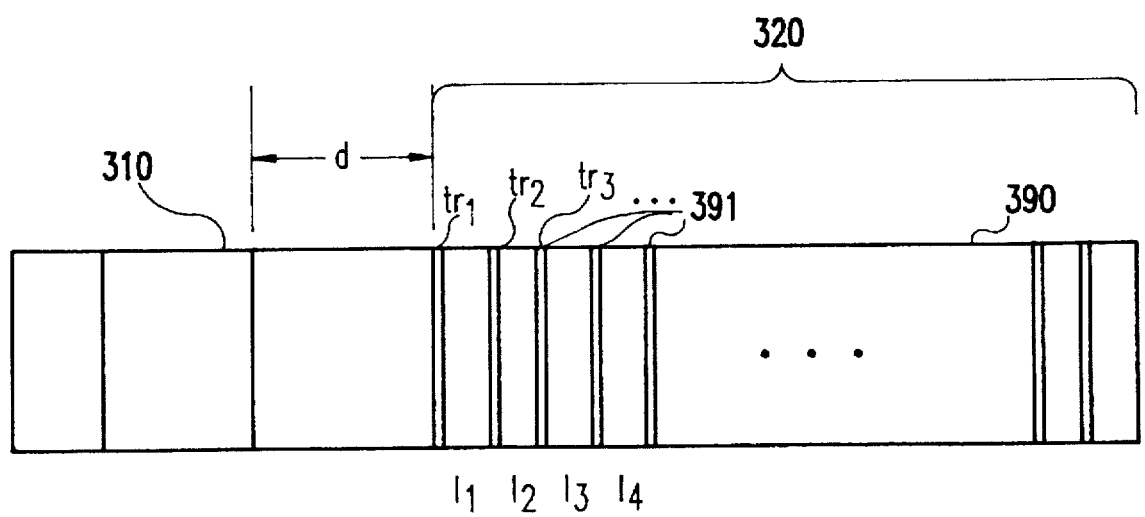
FIG. 3a is an enlarged detail of a variant form of the mask pattern of FIG. 3.

A variant form of a detail of the mask pattern of FIG. 3 and bounded therein by dashed rectangle 390 is shown greatly enlarged in FIG. 3a. In this case, substantially transparent feature 310 continues to be used to anchor or provide a reference location for the image produced by feature 320 and the measurement of d. Feature 320 is composed of areas of graded light transmission which can be achieved with lines or dots which cannot be resolved by imaging system 120 and but which are preferably of a size and spacing to be readily measured or inspected visually such as by a microscope or an optical metrology tool when the resist is developed. For example, such areas may be composed of sub-resolution lines or dots such that the areas differ from each other in transparency (e.g. $\Delta tr=(tr_2-tr_1)=(tr_3-tr_2), \ldots$, etc., such as 1% or some known, functionally variable increment therebetween, $\Delta tr=f(x)$). Spacing between areas (e.g. $l_1, l_2$, etc.) is preferably equal but may be variable (e.g. monotonically, such as linearly, exponentially, etc.).

It is important to note that the use of graded transmission areas which are spaced so as to produce resist images large enough and far enough apart serves to quantize the dimension of interest, d, and allows d to be measured with convenient optical methods such as a microscope or an optical metrology tool. It is also important to understand that in the processing of lithographic resists, widths and/or separations of patterns produced by exposure and development are routinely measured by commercially available optical metrology tools which effectively overlay the resist patterns with a known pattern. Such optical metrology tools can also be used to measure dimension d produced by the pattern of FIG. 3 or FIG. 3A with very high precision. Thus, the test pattern images may be evaluated in the same process as the optical inspection of the resist pattern on the wafer and no additional process time is required. By the same token, need for evaluation with a scanning electron microscope is eliminated. Further, by selection of distance between mask lines of FIG. 3A and varying transmissivity (e.g. transparency or density) of the mask lines 391 in small increments, very small differences in effective dose or poisoning of the resist may be observed using either an optical microscope or an overlay type optical metrology tool as noted above, particularly using sub-resolution features, and yielding much increased sensitivity of the test.

Moreover, when transmission graded structures are used together with the sensitivity enhancement of time separation between two or more test exposures, sensitivity is further increased in an unexpected manner as a function of both $t_1$ and $\Delta tr$. In fact, whereas time separation of exposures of a small multiple of wafer lithographic exposure could raise the sensitivity of the test for contaminant gases tenfold (thus approximately equalling the sensitivity of the most sensitive known tests), the combination of density or transmission grading together with a comparable time interval between test exposures yields a ten-fold to fifteen-fold increase in sensitivity which is believed capable of detecting as little as ten parts per trillion (PPT) of amines contaminants in the atmosphere.

Figure 5:
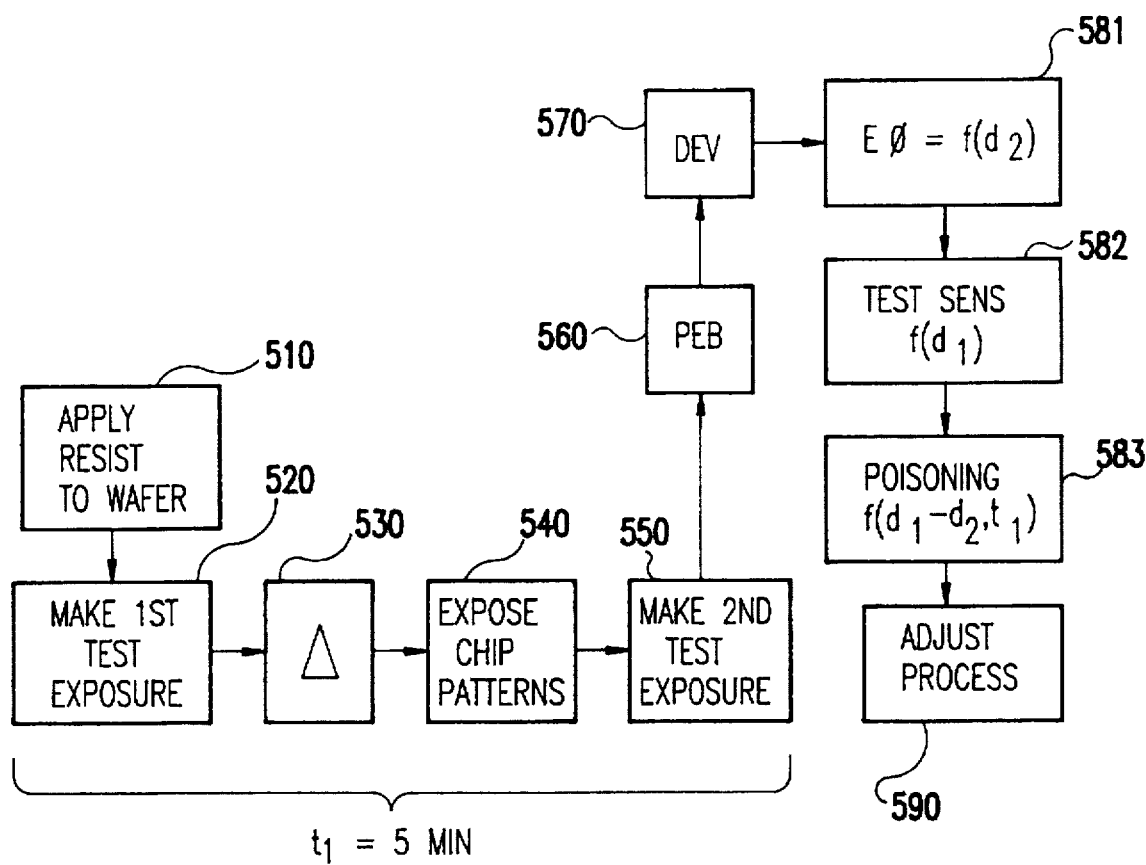
FIG. 5 is a flow chart illustrating a preferred method of practicing the invention.

Thus, the preferred process for practicing the invention is illustrated in the flow chart of FIG. 5. However, it is to be understood that not all of the steps depicted are necessary to successfully practicing basic or variant forms of the invention to derive its meritorious effects as described above. Once the resist is applied by an appropriate process dictated by the particular resist employed, as indicated at 510, a first test exposure (or series of exposures, as described with reference to, for example, FIG. 2a) is made (520). Then, it is preferred that a time interval 530 be provided corresponding to $t_1$. This time interval could be omitted in the practice of the invention in accordance with FIGS. 2a–2c although increased test sensitivity would not accrue. In the event that chip pattern exposures are made on the wafer (to decrease cost of the test by concurrently forming portions of devices) the time interval 530 should be adjusted so that the sum of the total time of interval 530 and the duration of the lithographic exposures of chip patterns 540 equals $t_1$, as indicated by a bracket in FIG. 5. It is preferred that time interval 530 exceed lithographic exposure duration by a small factor (e.g. two to four) for significant sensitivity increase.

At the end of time interval $t_1$, a second test exposure is made as indicated at 550. Additional intervening test exposures could also be made and may be useful for more accurately assessing the sensitivity of the test and the rate of resist poisoning (or, by extrapolation, the exposure sensitivity of the resist without poisoning). A post-exposure bake (PEB) 560 preferably immediately follows the final (e.g. second) test exposure to minimize poisoning of the area of the final test exposure during the period it is most sensitive to contaminant gases. Minimizing this interval thus produces highest accuracy and sensitivity of the test to poisoning since it serves to maximize the difference between $d_1$ and $d_2$ dimensions in the test images.

After PEB and subsequent development, indicated at 570, the test images produced can be evaluated optically, either by direct qualitative inspection (e.g. a gross difference in the size of areas 350 and 360 is strongly indicative of some degree of poisoning whereas substantial similarity indicates that no action need be taken to adjust the process) or measurement (e.g. either dimensionally or photometrically) and analyzed by computation of the functions discussed above to determine the E0 dose (581), the sensitivity of the test (582) and the degree of poisoning/loss of resist sensitivity (583). Upon completion thereof, all information will be available to adjust the process parameters (590) such as adjustment of the E0 dose or to initiate or schedule repairs or renewal of filtration or active gas removal systems.

In view of the foregoing, it is evident that the method and apparatus of the present invention provides low-cost and substantially real-time monitoring of a lithographic exposure system or tool for damage or degradation of a resist, especially due to exposure to contaminant gases to which chemically amplified resists, in particular, are sensitive. The method and apparatus of the invention provide several mechanisms for increasing sensitivity. Adequate monitoring capability is provided to detect onset of failure of systems intended to prevent resist poisoning while the degree of resist poisoning, if any, is small to assure high process yield. The method and apparatus of the invention provides direct measurement of resist sensitivity and degree of resist poisoning, if any, while simultaneously yielding information for making compensating corrections in the E0 dose, if required, while eliminating other variables of the lithographic exposure process with very little impact on exposure tool throughput.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of monitoring lithographic resist poisoning by ambient materials including the steps of exposing selected areas of a layer of lithographic resist with exposure radiation over a range of exposure dosage, exposing said layer of lithographic resist to ambient conditions which may include a contaminant capable of reducing exposure sensitivity of said resist for a period of time, developing said lithographic resist, determining an exposure dose which is sufficient for full removal of said resist corresponding to exposure of one of said selected areas, and evaluating a degree of resist poisoning by said contaminant gas based on said exposure dose determined in said determining step.

2. A method as recited in claim 1, wherein said determining step is performed qualitatively by visual inspection.

3. A method as recited in claim 1, wherein said determining step is performed quantitatively by a measurement step.

4. A method as recited in claim 3, wherein said measurement step is performed photometrically.

5. A method as recited in claim 1, wherein said exposing step is performed with a uniform density mask feature.

6. A method as recited in claim 1, wherein said exposing step is performed with a graded density mask feature.

7. A method as recited in claim 6, including the further step of producing a resist pattern of spaced lines formed during exposure of sub-resolution line features on the mask.

8. A method as recited in claim 6, including the further step of producing a resist pattern of spaced lines formed during exposure of sub-resolution dot features on the mask.

9. A method as recited in claim 3, wherein said measurement step is performed by optical overlay metrology.

10. A method of determining a degree of poisoning of a lithographic resist on a wafer including the steps of exposing a first portion of said resist with an exposure tool in a pattern having a graded density feature, subsequently, after a time interval of exposure of said resist to ambient conditions which may include a contaminant, exposing a second portion of said resist with an exposure tool in a pattern having said graded density feature, developing said resist, and comparing images made by said step of exposing a first portion of said resist and exposing a second portion of said resist to determine a degree of resist poisoning.

11. A method as recited in claim 10, including the further step of inspecting an image formed by said step of exposing a second portion of said resist to determine an exposure dose.

12. A method as recited in claim 10, wherein said time interval exceeds an amount of time required for lithographic exposure of electronic circuit structure patterns on a wafer.

13. A method as recited in claim 10, including the further step of exposing electronic circuit structure patterns on said wafer.

14. A method as recited in claim 13, wherein said time interval exceeds an amount of time required for lithographic exposure of electronic circuit structure patterns on a wafer.

15. A method as recited in claim 10, wherein said resist is a chemically amplified resist and including the further step of baking said resist after said step of exposing a second portion of said resist.

16. A method as recited in claim 10, wherein said pattern used in said steps of exposing said first and second portions of said resist includes a feature of substantially uniform density.

17. A method as recited in claim 10, wherein said steps of exposing said first and second portions of said resist includes the step of forming an image of spaced lines of sub-resolution width.

18. A method as recited in claim 10, wherein said steps of exposing said first and second portions of said resist includes the step of forming an image of spaced dots of sub-resolution dimension.

19. A method as recited in claim 10, including the further step of detecting onset of failure of a gas treatment system in accordance with said degree of poisoning.

20. A method as recited in claim 10, wherein said comparing step is preformed by overlay optical metrology.

* * * * *